_(12)_ United States Patent
Wu

(10) Patent No.: US 11,463,080 B2
(45) Date of Patent: Oct. 4, 2022

(54) POWER SWITCH CIRCUIT

(71) Applicant: uPI semiconductor corp., Zhubei (TW)

(72) Inventor: Chia-Lung Wu, Zhubei (TW)

(73) Assignee: UPI SEMICONDUCTOR CORP., Zhubei (TW)

( * ) Notice: Subject to any disclaimer, the term of this patent is extended or adjusted under 35 U.S.C. 154(b) by 0 days.

(21) Appl. No.: 17/249,695

(22) Filed: Mar. 10, 2021

(65) Prior Publication Data

US 2021/0288635 A1 Sep. 16, 2021

(30) Foreign Application Priority Data

Mar. 11, 2020 (CN) .......................... 202010165266.7

(51) Int. Cl.
*H03K 17/082* (2006.01)
(52) U.S. Cl.
CPC .................................. *H03K 17/082* (2013.01)
(58) Field of Classification Search
CPC .......................... H03K 17/082; H03K 17/0822
See application file for complete search history.

(56) References Cited

U.S. PATENT DOCUMENTS

| | | | | |
|---|---|---|---|---|
| 4,237,425 A * | 12/1980 | Spiegel | ................. | H03F 1/3205 330/273 |
| 5,585,701 A * | 12/1996 | Kaida | ................. | G01R 19/0092 318/400.27 |
| 5,872,736 A * | 2/1999 | Keeth | ................. | G11C 7/1093 365/207 |
| 6,674,679 B1 * | 1/2004 | Perner | ................. | G11C 7/062 365/207 |
| 8,159,281 B2 | 4/2012 | Chang et al. | | |
| 9,467,136 B1 | 10/2016 | Nguyen | | |
| 9,671,438 B2 | 6/2017 | Zhang et al. | | |
| 10,177,576 B2 | 1/2019 | Huang et al. | | |
| 10,348,280 B2 * | 7/2019 | Chauhan | ................. | G05F 1/46 |
| 10,418,986 B2 | 9/2019 | Nguyen et al. | | |
| 2012/0126768 A1 * | 5/2012 | Ishino | ................. | H02M 3/156 323/283 |
| 2012/0176178 A1 | 7/2012 | Yang et al. | | |
| 2020/0204124 A1 * | 6/2020 | Singh | ................. | H03F 3/21 |

* cited by examiner

*Primary Examiner* — Scott Bauer
(74) *Attorney, Agent, or Firm* — McClure, Qualey & Rodack, LLP

(57) ABSTRACT

A power switch circuit is disclosed. The power switch circuit includes an input terminal, an output terminal, a first switch, a second switch, a sensing switch and an adjusting circuit. The first switch is coupled to the input terminal. The second switch is coupled to the first switch and the output terminal. A first node between the first switch and the second switch has a first node voltage. A breakdown voltage of the second switch is higher than that of the first switch. The sensing switch is coupled to the input terminal and the first switch. The adjusting circuit is coupled to the first node and the sensing switch. A second node between the adjusting circuit and the sensing switch has a second node voltage. The adjusting circuit adjusts the second node voltage according to the first node voltage to make it equal to the first node voltage.

10 Claims, 5 Drawing Sheets

POWER SWITCH CIRCUIT

BACKGROUND OF THE INVENTION

1. Field of the Invention

The invention relates to a power switch; in particular, to a power switch circuit.

2. Description of the Prior Art

In general, a sensing switch matched with a power switch is usually provided in a conventional power switch circuit to generate a sensing current, and the sensing current is transmitted to an over-current protection circuit through a current replication circuit to provide an over-current protection mechanism.

As shown in FIG. 1, during a period from a time t1 to a time t2, an output current IL continues to rise. During a period from the time t2 to a time t3, the over-current protection circuit starts to increase an on-resistance RON of the power switch correspondingly by reducing a control voltage VG of the power switch, thereby limiting the output current IL to a current value IOCP1, so that the over-current phenomenon can be effectively avoided. However, at this time, since the supply of the output current IL is limited and the load continues to be consumed, an output voltage VOUT begins to drop.

At the time t3, when the output voltage VOUT drops to close to 0 volts (V), a current replication circuit or a sensing resistor is coupled between a drain of the sensing switch and the ground, so that the drain voltages of the power switch and the sensing switch are inconsistent, and there is a deviation of about 0.2V between them, which leads to a misjudgment by the over-current protection circuit at the rear, and the output current IL, which was originally limited to the current value IOCP1, is raised to a higher current value IOCP2. There is an error of about 10%~20% between the current values IOCP1 and IOCP2. This shortcoming needs to be improved.

SUMMARY OF THE INVENTION

Therefore, the invention provides a power switch circuit to solve the above-mentioned problems of the prior arts.

A preferred embodiment of the invention is a power switch circuit. In this embodiment, the power switch circuit includes an input terminal, an output terminal, a first switch, a second switch, a sensing switch and an adjusting circuit. The first switch is coupled to the input terminal. The second switch is coupled to the first switch and the output terminal. A first node between the first switch and the second switch has a first node voltage. A breakdown voltage of the second switch is higher than that of the first switch. The sensing switch is coupled to the input terminal and the first switch. The adjusting circuit is coupled to the first node and the sensing switch. A second node between the adjusting circuit and the sensing switch has a second node voltage. The adjusting circuit is configured to adjust the second node voltage according to the first node voltage to make it equal to the first node voltage.

In an embodiment, the power switch circuit further includes an over-current protection circuit. The over-current protection circuit is coupled to a control terminal of the first switch and the sensing switch respectively and configured to generate a control voltage according to a first sensing signal provided by the sensing switch to adjust a resistance of the first switch.

In an embodiment, the over-current protection circuit further includes a first error amplifier, two input terminals of the first error amplifier are coupled to a reference voltage and the sensing switch respectively and the first error amplifier is configured to generate the control voltage according to the reference voltage and the first sensing signal.

In an embodiment, the sensing switch is matched with the first switch, the gates of the sensing switch and the first switch are coupled to each other and the sources of the sensing switch and the first switch are coupled to each other.

In an embodiment, the adjusting circuit further includes a second error amplifier and a third switch, and the adjusting circuit is configured to adjust a resistance of the third switch according to the first node voltage and the second node voltage.

In an embodiment, the power switch circuit further includes a current replication circuit. The current replication circuit is coupled to the sensing switch and configured to generate a second sensing signal according to a first sensing signal provided by the sensing switch.

In an embodiment, the current replication circuit further includes a fourth switch which is matched with the third switch.

In an embodiment, the current replication circuit further includes a current mirror coupled to the fourth switch and configured to generate the second sensing signal according to the first sensing signal.

In an embodiment, the power switch circuit further includes a resistor. The resistor is coupled to the current replication circuit and a ground and configured to convert the second sensing signal having current type generated by the current replication circuit into the second sensing signal having voltage type and provide the second sensing signal having voltage type to an over-current protection circuit.

In an embodiment, the power switch circuit further includes an over-current protection circuit. The over-current protection circuit is coupled to a control terminal of the first switch and the current replication circuit and configured to generate a control voltage according to the second sensing signal provided by the current replication circuit to adjust a resistance of the first switch.

Compared to the prior art, the power switch circuit of the invention is coupled in series with the second switch between the first switch and the output terminal, so that the source voltage of the first switch does not drop to 0 volts, and then the source voltage of the sensing switch is adjusted by the adjusting circuit to make it equal to the drain voltage of the first switch to eliminate the voltage error caused by the current replication circuit, so that the over-current protection circuit can generate a control voltage according to the accurate sensing voltage, thereby achieving the effect of limiting the output current. In addition, the power switch circuit of the invention can also provide a fool-proof function to effectively prevent the current from flowing back to the power switch circuit from the load side to prevent the circuit from being burned.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

Figure 1:
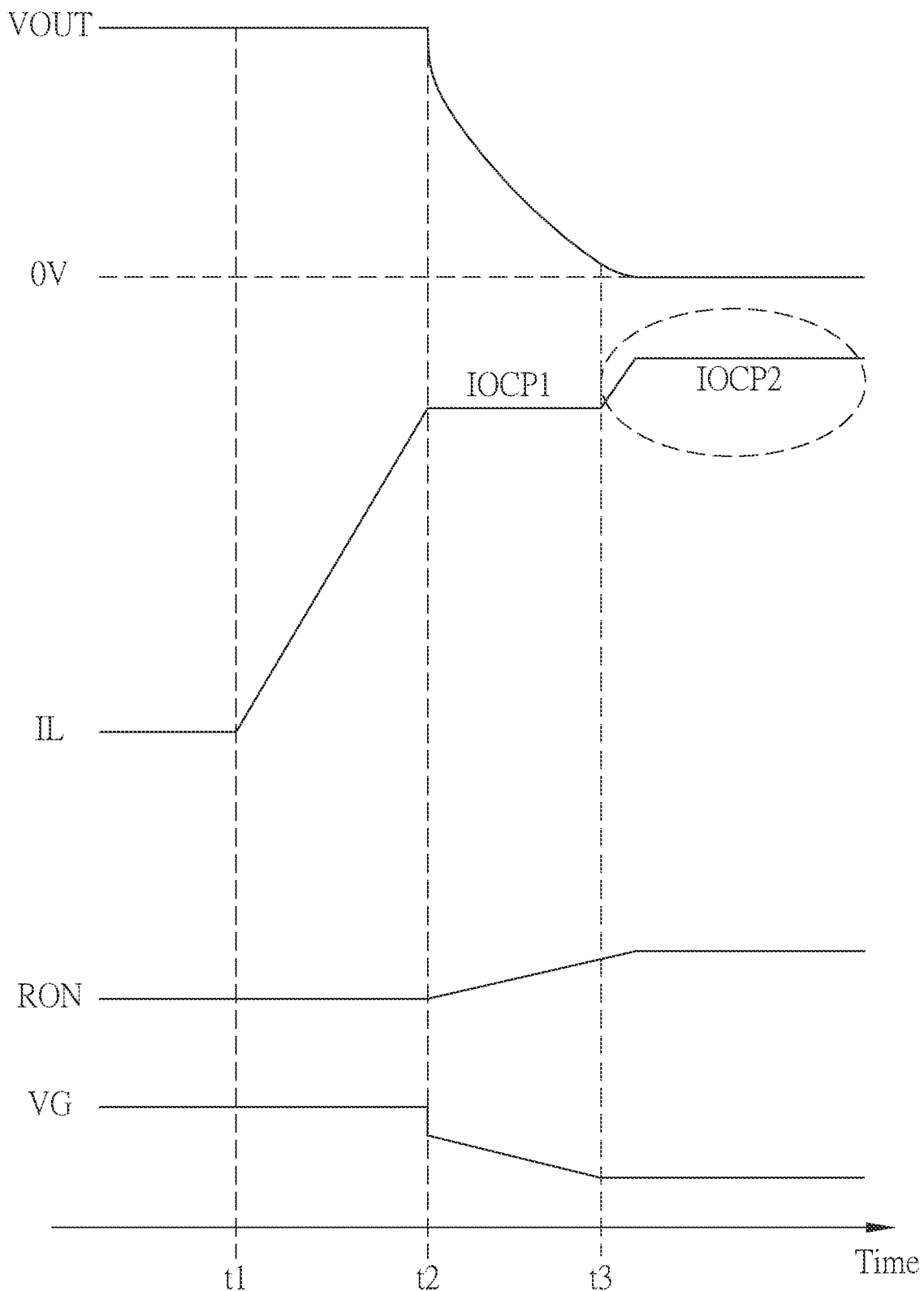
FIG. 1 illustrates a schematic diagram of the waveform of the over-current protection of the power switch circuit in the prior art.

Reference will now be made in detail to the exemplary embodiments, the same or similar reference numbers or components used in the drawings and the embodiments are used to represent the same or similar parts.

Figure 2A:
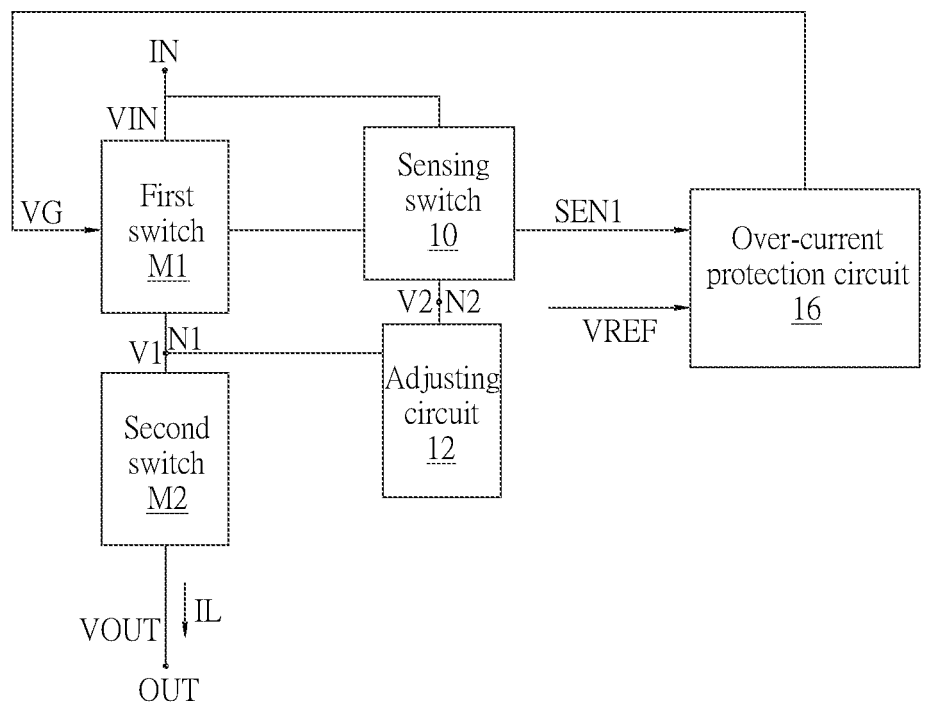
FIG. 2A illustrates a functional block diagram of the power switch circuit 1 in an embodiment of the invention.

An embodiment of the invention is a power switch circuit. As shown in FIG. 2A, the power switch circuit 1 includes an input terminal IN, an output terminal OUT, a first switch M1, a second switch M2, a sensing switch 10, an adjusting circuit 12 and an over-current protection circuit 16. A breakdown voltage of the second switch M2 is higher than a breakdown voltage of the first switch M1. The sensing switch 10 is matched with the first switch M1. The gates of the sensing switch 10 and the first switch M1 are coupled to each other. The drains of the sensing switch 10 and the first switch M1 are coupled to each other.

It should be noted that the power switch circuit 1 of the invention only uses a MOSFET sensing-type circuit, and the breakdown voltage of the second switch M2 needs to be higher than the breakdown voltage of the first switch M1, which is intended to prevent flowing back to the power switch circuit 1 from the load side, and can simultaneously increase the drain voltage of the first switch M1. Because the second switch M2 may be used to prevent the voltage of 24 volts (V) from flowing back from the output terminal OUT to the input terminal IN, so a high-voltage component with a gate-drain voltage (Vgd) greater than 19 volts (V) is used as the second switch M2 in the embodiment.

The first switch M1 and the second switch M2 are coupled in series between the input terminal IN and the output terminal OUT. The input terminal IN has an input voltage VIN. The output terminal OUT has an output voltage VOUT. There is a first node N1 between the first switch M1 and the second switch M2. The first node N1 has a first node voltage V1. The output current IL flows from the second switch M2 to the output terminal OUT. The first node voltage V1 of the first node N1=the output current IL*the on-resistance RON+ the output voltage VOUT.

The sensing switch 10 is coupled to the input terminal IN, the first switch M1 and the over-current protection circuit 16 respectively. The adjusting circuit 12 is coupled to the first node N1 and the sensing switch 10. There is a second node N2 between the sensing switch 10 and the adjusting circuit 12. The second node N2 has a second node voltage V2. The sensing switch 10 provides a first sensing signal SEN1 to the over-current protection circuit 16. The adjusting circuit 12 adjusts the second node voltage V2 according to the first node voltage V1 to make the adjusted second node voltage V2 equal to the first node voltage V1.

The over-current protection circuit 16 is coupled to a control terminal of the first switch M1 and the sensing switch 10 respectively. The over-current protection circuit 16 receives a reference voltage VREF and the first sensing signal SEN1 provided by the sensing switch 10 respectively and generates a control voltage VG to the control terminal of the first switch M1 according to the first sensing signal SEN1 and the reference voltage VREF to adjust a resistance of the first switch M1.

For example, the over-current protection circuit 16 reduces a control voltage VG provided to the first switch M1 to increase an on-resistance of the sensing switch 10 to limit the output current IL flowing through the second switch M2, but not limited to this.

Figure 2B:
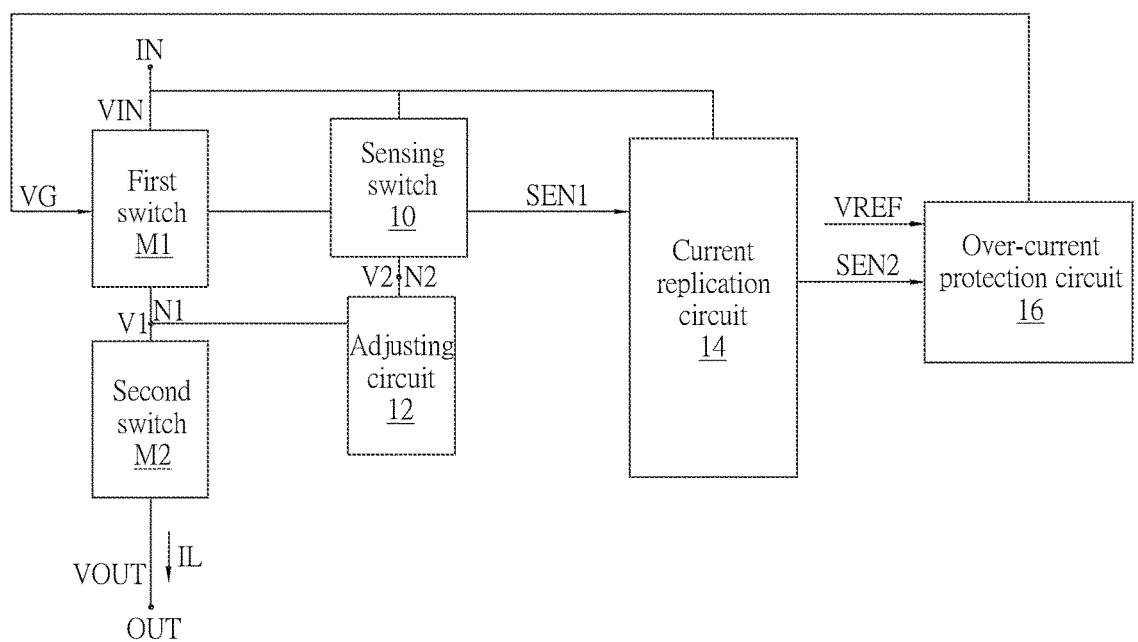
FIG. 2B illustrates a functional block diagram of the power switch circuit 1' in another embodiment of the invention.

In another embodiment, as shown in FIG. 2B, the power switch circuit 1' includes an input terminal IN, an output terminal OUT, a first switch M1, a second switch M2, a sensing switch 10, an adjusting circuit 12, a current replication circuit 14 and an over-current protection circuit 16. A breakdown voltage of the second switch M2 is higher than a breakdown voltage of the first switch M1. The sensing switch 10 is matched with the first switch M1. The gates of the sensing switch 10 and the gate and the first switch M1 are coupled to each other. The drains of the sensing switch 10 and the gate and the first switch M1 are coupled to each other.

The first switch M1 and the second switch M2 are coupled in series between the input terminal IN and the output terminal OUT. The input terminal IN has an input voltage VIN. The output terminal OUT has an output voltage VOUT. There is a first node N1 between the first switch M1 and the second switch M2. The first node N1 has a first node voltage V1.

The sensing switch 10 is coupled to the input terminal IN, the first switch M1 and the current replication circuit 14 respectively. The adjusting circuit 12 is coupled to the first node N1 and the sensing switch 10. There is a second node N2 between the sensing switch 10 and the adjusting circuit 12. The second node N2 has a second node voltage V2. The sensing switch 10 provides a first sensing signal SEN1 to the current replication circuit 14. The adjusting circuit 12 adjusts the second node voltage V2 according to the first node voltage V1 to make the adjusted second node voltage V2 equal to the first node voltage V1.

The current replication circuit 14 is coupled to the sensing switch 10 and the over-current protection circuit 16 respectively. When the current replication circuit 14 receives the first sensing signal SEN1 provided by the sensing switch 10, the current replication circuit 14 generates a second sensing signal SEN2 according to the first sensing signal SEN1 and provides the second sensing signal SEN2 to the over-current protection circuit 16.

The over-current protection circuit 16 is coupled to the current replication circuit 14 and the control terminal of the first switch M1 respectively. The over-current protection circuit 16 receives a reference voltage VREF and the second sensing signal SEN2 provided by the current replication circuit 14 and generates a control voltage VG to the control terminal of the first switch M1 according to the second sensing signal SEN2 and the reference voltage VREF to adjust a resistance of the first switch M1.

For example, the over-current protection circuit 16 increases an on-resistance of the sensing switch 10 by reducing a control voltage VG provided to the first switch M1, so as to limit the output current IL flowing from the second switch M2, but not limited to this.

Figure 3:
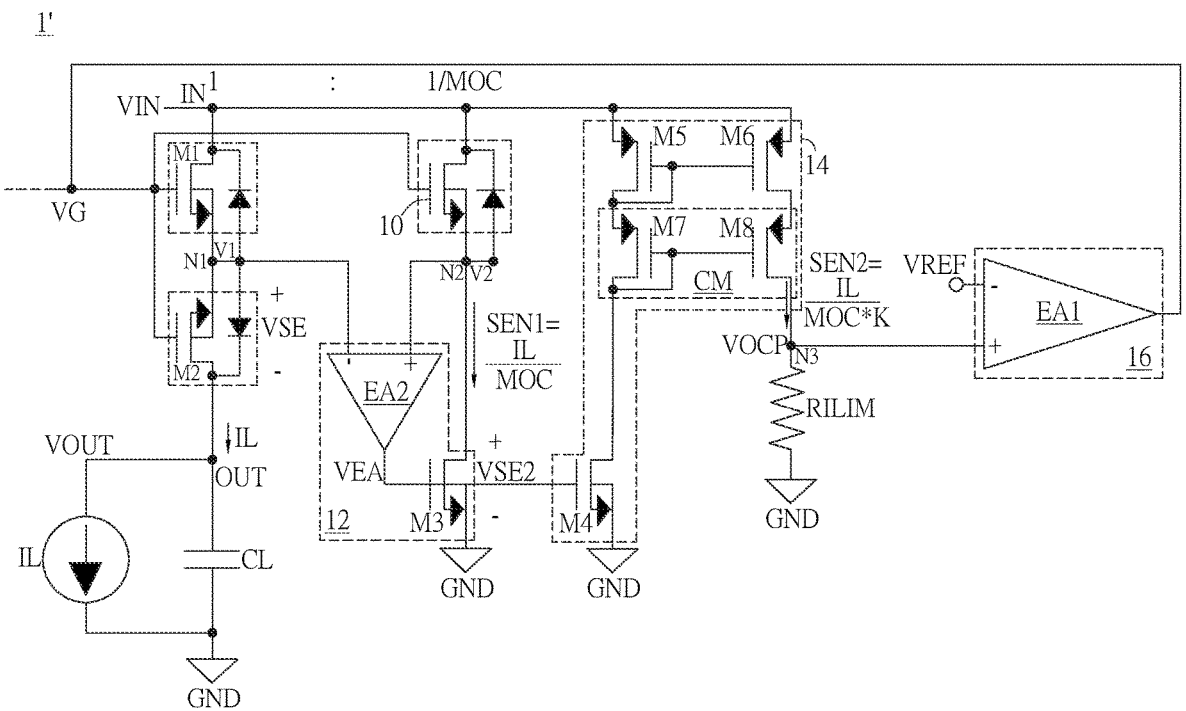
FIG. 3 illustrates a schematic diagram of the circuit structure of the power switch circuit 1' in FIG. 2B.

Next, please refer to FIG. 3. FIG. 3 illustrates a schematic diagram of the circuit structure of the power switch circuit 1' in FIG. 2B. It should be noted that FIG. 3 is only an embodiment of the circuit structure of the power switch circuit 1', and not limited to this.

As shown in FIG. 3, the power switch circuit 1' includes an input terminal IN, an output terminal OUT, a first switch M1, a second switch M2, a sensing switch 10, an adjusting circuit 12, a current replication circuit 14, an output capacitor CL, a resistor RILIM and an over-current protection circuit 16. The sensing switch 10 is matched with the first switch M1. The gates of the sensing switch 10 and the first switch M1 are coupled to each other. The drains of the sensing switch 10 and the first switch M1 are coupled to each other.

The input terminal IN has an input voltage VIN. The output terminal OUT has an output voltage VOUT. The first switch M1 and the second switch M2 are coupled in series between the input terminal IN and the output terminal OUT. A breakdown voltage of the second switch M2 is higher than a breakdown voltage of the first switch M1. A control terminal of the first switch M1 is controlled by the control voltage VG. The second switch M2 generates an output current IL to flow to the output terminal OUT. The output capacitor CL is coupled between the output terminal OUT and the ground GND. There is a first node N1 between the first switch M1 and the second switch M2. The first node N1 has a first node voltage V1. In this embodiment, it is assumed that a voltage across the second switch M2 between the first node N1 and the output terminal OUT is VSE; that is to say, the voltage across the second switch M2 VSE=the first node voltage V1-the output voltage VOUT.

The sensing switch 10 is coupled between the input terminal IN and the adjusting circuit 12. The control terminal of the sensing switch 10 is also controlled by the control voltage VG. There is a second node N2 between the sensing switch 10 and the adjusting circuit 12. The second node N2 has a second node voltage V2. The sensing switch 10 is matched with the first switch M1. In this embodiment, an area ratio of the first switch M1 to the first switch M1 is 1:1/MOC, but not limited to this.

The adjusting circuit 12 includes a second error amplifier EA2 and a third switch M3. The third switch M3 is coupled between the sensing switch 10 and the ground GND. The voltage across the third switch M3 is VSE2. The sensing switch 10 generates the first sensing signal SEN1 to the third switch M3. The first sensing signal SEN1 has a current type and the first sensing signal SEN1=IL/MOC. A negative input terminal− and a positive input terminal+ of the second error amplifier EA2 are coupled to the first node N1 and the second node N2 respectively for receiving the first node voltage V1 and the second node voltage V2 respectively. The output terminal of the second error amplifier EA2 is coupled to the control terminal of the third switch M3. The second error amplifier EA2 generates a control voltage VEA to the control terminal of the third switch M3 according to the received first node voltage V1 and the second node voltage V2 to adjust an on-resistance of the third switch M3 to achieve the effect of adjusting the second node voltage V2.

The current replication circuit 14 includes a fourth switch M4 to an eighth switch M8. The control terminal of the fourth switch M4 is coupled to the output terminal of the second error amplifier EA2. The fifth switch M5, the seventh switch M7 and the fourth switch M4 are coupled in series between the input terminal IN and the ground GND. The sixth switch M6, the eighth switch M8 and the resistor RILIM are coupled in series between the input terminal IN and the ground GND. The control terminals of the fifth switch M5 and the sixth switch M6 are coupled to each other. The control terminals of the seventh switch M7 and the eighth switch M8 are coupled to each other. The fourth switch M4 is matched with the third switch M3 and also controlled by the first sensing signal SEN1 outputted by the second error amplifier EA2.

The seventh switch M7 and the eighth switch M8 form a current mirror CM. The current mirror CM is coupled to the fourth switch M4 for generating the second sensing signal SEN2 according to the first sensing signal SEN1. In this embodiment, since the first sensing signal SEN1 having current type is IL/MOC, and it is assumed that the replication magnification of the current mirror CM is K, the second sensing signal SEN2 also has current type and the second sensing signal SEN2=IL/(MOC*K).

It should be noted that since the second sensing signal SEN2 generated by the current mirror CM of the current replication circuit 14 has current type, the resistor RILIM coupled between the current mirror CM and the ground GND can be used to convert the second sensing signal SEN2 having current type into the second sensing signal SEN2 having voltage type; that is to say, a third node N3 between the current mirror CM and the resistor RILIM has a third node voltage VOCP=(IL*RILIM)/(MOC*K) and the third node voltage VOCP is provided to the over-current protection circuit 16.

In practical applications, the resistor RILIM can be externally coupled, and an upper limit value IOCP1 of the output current IL can be set by selecting the resistance value of the resistor RILIM.

The over-current protection circuit 16 includes a first error amplifier EA1. A positive input terminal+ of the first error amplifier EA1 is coupled to the third node N3 between the current mirror CM and the resistor RILIM, and a negative input terminal− of the first error amplifier EA1 is coupled to a reference voltage VREF. An output terminal of the first error amplifier EA1 is coupled to the control terminals of the first switch M1 and the second switch M2. The positive input terminal+ and the negative input terminal− of the first error amplifier EA1 receive the reference voltage VREF and the second sensing signal SEN2 respectively (that is to say, the third node voltage VOCP=(IL*RILIM)/(MOC*K)), and the first error amplifier EA1 generates a control voltage VG to the control terminals of the first switch M1 and the second switch M2 according to the reference voltage VREF and the second sensing signal SEN2 having voltage type to adjust the on-resistances of the first switch M1 and the second switch M2.

Figure 4:
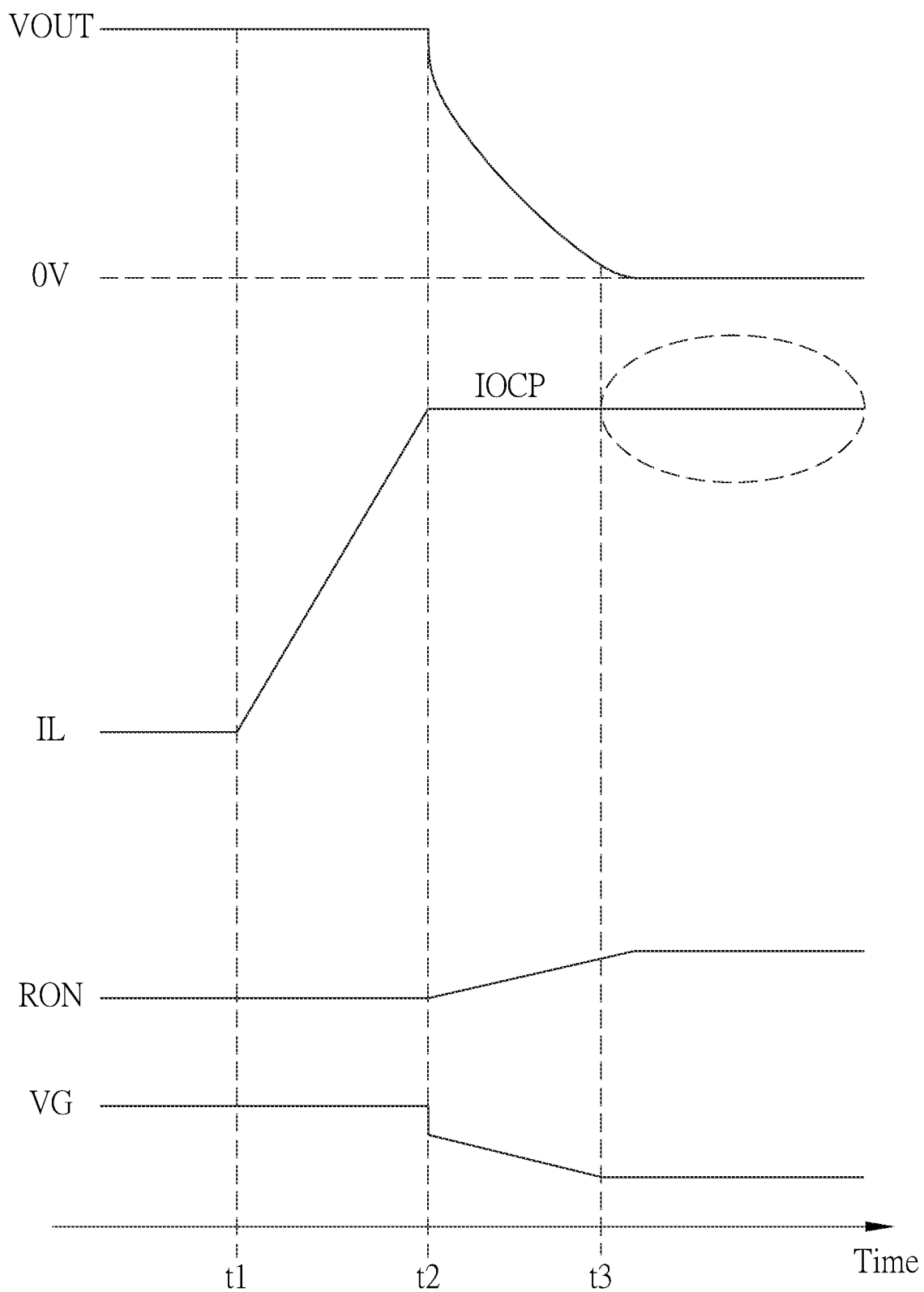
FIG. 4 illustrates a schematic diagram of the waveform of the over-current protection of the power switch circuit in the invention.

Next, please refer to FIG. 4. During a period from a time t1 to a time t2, the output current IL flowing from the second switch M2 continues to rise. During a period from the time t2 to a time t3, the over-current protection circuit 16 starts to reduce the control voltage VG provided to the first switch M1 and the second switch M2 to increase the on-resistances RON of the first switch M1 and the second switch M2. The output current IL is limited to the current value IOCP to avoid the over-current phenomenon. At this time, the output current IL is limited to the current value IOCP and the load continues to be consumed, causing the output voltage VOUT of the output terminal OUT to begin to drop. When the reference voltage VREF is equal to the second sensing signal SEN2 having voltage type, that is to say, the reference voltage VREF=the third node voltage VOCP=(IL*RILIM)/(MOC*K), then the output current IL=IOCP=(VREF*MOC*K)/RILIM.

At the time t3, the output voltage VOUT drops to close to 0 volts (V). At this time, since the source voltage of the first switch M1 (that is, the first node voltage V1 of the first node N1) and the source voltage of the sensing switch 10 (that is, the second node voltage V2 of the second node N2) are equal, so that the sensing voltage VSE2 generated by the sensing switch 10 is not affected by the bias voltage related to the on-resistance RON of the elements in the adjusting circuit 12 or the current replication circuit 14. Therefore, the output current IL originally limited to the current value IOCP is still maintained at the current value IOCP and will not be raised to a higher current value, so the current error in the prior art can be effectively eliminated.

Compared to the prior art, the power switch circuit of the invention is coupled in series with the second switch between the first switch and the output terminal, so that the source voltage of the first switch does not drop to 0 volts, and then the source voltage of the sensing switch is adjusted by the adjusting circuit to make it equal to the source voltage of the first switch to eliminate the voltage error caused by the current replication circuit, so that the over-current protection circuit can generate a control voltage according to the accurate sensing voltage, thereby achieving the effect of limiting the output current. In addition, the power switch circuit of the invention can also provide a fool-proof function to effectively prevent the current from flowing back to the power switch circuit from the load side to prevent the circuit from being burned.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A power switch circuit, comprising:
   an input terminal;
   an output terminal;
   a first switch, coupled to the input terminal;
   a second switch, coupled between the first switch and the output terminal, wherein the second switch has a control terminal coupled to a control terminal of the first switch, and a control voltage is provided to the control terminals of the first switch and the second switch to control operations of the first switch and the second switch, a first node between the first switch and the second switch has a first node voltage, and a breakdown voltage of the second switch is higher than a breakdown voltage of the first switch;
   a sensing switch, coupled to the input terminal and the first switch; and
   an adjusting circuit, coupled to the first node and the sensing switch, wherein a second node between the adjusting circuit and the sensing switch has a second node voltage, and the adjusting circuit is configured to adjust the second node voltage according to the first node voltage to make the adjusted second node voltage equal to the first node voltage.

2. The power switch circuit of claim 1, further comprising:
   an over-current protection circuit, coupled to the control terminal of the first switch and the sensing switch respectively and configured to generate the control voltage according to a first sensing signal provided by the sensing switch to adjust a resistance of the first switch.

3. The power switch circuit of claim 2, wherein the over-current protection circuit comprises a first error amplifier, two input terminals of the first error amplifier are coupled to a reference voltage and the sensing switch respectively and the first error amplifier is configured to generate the control voltage according to the reference voltage and the first sensing signal.

4. The power switch circuit of claim 1, wherein the sensing switch is matched with the first switch, the gates of the sensing switch and the first switch are coupled to each other and the sources of the sensing switch and the first switch are coupled to each other.

5. The power switch circuit of claim 1, wherein the adjusting circuit comprises a first error amplifier and a third switch, and the adjusting circuit is configured to adjust a resistance of the third switch according to the first node voltage and the second node voltage.

6. The power switch circuit of claim 5, further comprising:
   a current replication circuit, coupled to the sensing switch and configured to generate a second sensing signal according to a first sensing signal provided by the sensing switch.

7. The power switch circuit of claim 6, wherein the current replication circuit further comprises a fourth switch which is matched with the third switch.

8. The power switch circuit of claim 7, wherein the current replication circuit further comprises a current mirror coupled to the fourth switch and configured to generate the second sensing signal according to the first sensing signal.

9. The power switch circuit of claim 6, further comprising:
   a resistor, coupled to the current replication circuit and a ground and configured to convert the second sensing signal having current type generated by the current replication circuit into the second sensing signal having voltage type and provide the second sensing signal having voltage type to an over-current protection circuit.

10. The power switch circuit of claim 6, further comprising:
    an over-current protection circuit, coupled to the control terminal of the first switch and the current replication circuit and configured to generate the control voltage according to the second sensing signal provided by the current replication circuit to adjust a resistance of the first switch.

* * * * *